(12) United States Patent
Ye et al.

(10) Patent No.: US 12,079,426 B2
(45) Date of Patent: Sep. 3, 2024

(54) DISPLAY PANEL AND DISPLAY DEVICE

(71) Applicant: Wuhan China Star Optoelectronics Semiconductor Display Technology Co., Ltd., Hubei (CN)

(72) Inventors: Jian Ye, Hubei (CN); Pengfei Liang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/430,738

(22) PCT Filed: Jun. 18, 2021

(86) PCT No.: PCT/CN2021/100761
§ 371 (c)(1),
(2) Date: Aug. 13, 2021

(87) PCT Pub. No.: WO2022/241890
PCT Pub. Date: Nov. 24, 2022

(65) Prior Publication Data
US 2024/0012513 A1    Jan. 11, 2024

(30) Foreign Application Priority Data
May 20, 2021  (CN) .......................... 202110552892.6

(51) Int. Cl.
G06F 3/041        (2006.01)
G06F 3/044        (2006.01)
H10K 59/40        (2023.01)

(52) U.S. Cl.
CPC .......... *G06F 3/0418* (2013.01); *G06F 3/0412* (2013.01); *G06F 3/04164* (2019.05);
(Continued)

(58) Field of Classification Search
CPC .. G06F 3/0418; G06F 3/0412; G06F 3/04164; G06F 3/0443; G06F 3/0446;
(Continued)

(56) References Cited

U.S. PATENT DOCUMENTS

2010/0207891 A1   8/2010   Wang
2018/0203531 A1*  7/2018   Tsai .................... G06F 3/04164
(Continued)

FOREIGN PATENT DOCUMENTS

CN   107065269   8/2017
CN   107153491   9/2017
(Continued)

*Primary Examiner* — Temesghen Ghebretinsae
*Assistant Examiner* — Ivelisse Martinez Quiles

(57) ABSTRACT

A display panel and a display device are provided. A touch control signal wiring layer in the display panel includes a plurality of signal wirings correspondingly connected to a plurality of touch control sensing blocks by one to one and extending to a bonding area. The present disclosure reduces a bezel size of the display panel and also prevents the signal wirings from occupying spaces of the touch control sensing blocks in a display area by disposing the touch control signal wiring layer and a touch control electrode layer in different layers and disposing at least a part of a fan-out area in the display area, thereby ensuring touch control performances.

18 Claims, 5 Drawing Sheets

(52) U.S. Cl.
CPC .......... *G06F 3/0443* (2019.05); *G06F 3/0446* (2019.05); *H10K 59/40* (2023.02); *G06F 2203/04107* (2013.01)

(58) Field of Classification Search
CPC G06F 2203/04107; G06F 2203/04103; H10K 59/40
See application file for complete search history.

(56) References Cited

U.S. PATENT DOCUMENTS

| | | | |
|---|---|---|---|
| 2019/0294274 A1* | 9/2019 | Cho | G06F 3/0416 |
| 2022/0283672 A1* | 9/2022 | Fang | G06F 3/0446 |
| 2023/0097832 A1* | 3/2023 | Kuo | G06F 3/0412 |
| | | | 345/173 |
| 2023/0273702 A1* | 8/2023 | Kim | G06F 3/0412 |
| | | | 345/174 |

FOREIGN PATENT DOCUMENTS

| | | | | |
|---|---|---|---|---|
| CN | 107329617 | | 11/2017 | |
| CN | 109725756 | | 5/2019 | |
| CN | 111665998 | | 9/2020 | |
| CN | 111665998 A | * | 9/2020 | ........... G06F 3/0412 |
| CN | 111930265 | | 11/2020 | |
| CN | 111930266 | | 11/2020 | |
| CN | 112328117 | | 2/2021 | |

* cited by examiner

DISPLAY PANEL AND DISPLAY DEVICE

RELATED APPLICATIONS

This application is a National Phase of PCT Patent Application No. PCT/CN2021/100761 having International filing date of Jun. 18, 2021, which claims the benefit of priority of Chinese Patent Application No. 202110552892.6 filed on May 20, 2021. The contents of the above applications are all incorporated by reference as if fully set forth herein in their entirety.

FIELD AND BACKGROUND OF THE INVENTION

The present disclosure relates to the field of display technologies, and more particularly, to a display panel and a display device.

With development of technology and diversification of people's needs, touch control functions are increasingly used in display devices such as mobile phones, tablet computers, and car displays. Display panels in the display devices usually include touch control sensing blocks and integrated circuits, and realize signal transmissions by touch control signal lines connecting the touch control sensing blocks to the integrated circuits. The display panels having the touch control functions include the touch control sensing blocks, and each of the touch control sensing blocks is connected to drive integrated circuits by a corresponding signal wiring, which causes bezel areas to have a large number of signal wirings, thereby causing the display panels to have a larger bezel size.

In order to reduce spaces occupied by the signal wirings in the bezel areas and reduce a bezel size of the display panels, some existing display panels dispose a part of the signal wirings in display areas. However, this method will cause the signal wirings to occupy spaces of the touch control sensing blocks in the display areas, thereby affecting touch control performances of the display panels.

Technical problem: the present disclosure provides a display panel and a display device to solve a problem of the touch control performances being affected by adopting small bezel-sized designs in current display panels.

SUMMARY OF THE INVENTION

In a first aspect, the present disclosure provides a display panel, which includes:
a display substrate including a display area and a bezel area positioned on one side of the display area, wherein, the bezel area includes a bonding area; and
a touch control functional layer including a touch control signal wiring layer and a touch control electrode layer disposed on the display substrate in a stack, wherein, the touch control signal wiring layer and the touch control electrode layer are connected to each other by through-holes; wherein, the touch control electrode layer includes a plurality of touch control sensing blocks, and at least a part of the touch control sensing blocks is disposed in the display area; the touch control signal wiring layer includes a plurality of signal wirings, and the signal wirings are correspondingly connected to the touch control sensing blocks by one to one and extend to the bonding area;
wherein, the touch control functional layer includes a fan-out area positioned on one side of the display area adjacent to the bezel area, and at least a part of the fan-out area is positioned in the display area; and the signal wirings extend to the bonding area through the fan-out area and include a converging section positioned in the fan-out area, and an extending direction of the converging section intersects a direction from the fan-out area to the bonding area.

Optionally, the display substrate includes a substrate and a light-emitting layer disposed in a stack, the light-emitting layer includes a plurality of pixel units disposed at intervals, and the pixel units are positioned in the display area and include sub-pixel units; and
the signal wirings in the display area are staggered from the sub-pixel units.

Optionally, the signal wirings intersect to form a plurality of signal wiring grids, and each of the signal wiring grids corresponds to at least one of the sub-pixel units.

Optionally, the touch control sensing blocks include a plurality of touch control electrode lines, and at least a part of the touch control electrode lines is staggered from the signal wirings.

Optionally, the converging section extends along a length direction of an edge of the display area adjacent to the bezel area.

Optionally, the touch control electrode lines of the touch control sensing blocks intersect to form a plurality of touch control line grids, and each of the touch control line grids corresponds to at least one of the sub-pixel units;
the touch control line grids include a plurality of first grid groups and a plurality of second grid groups, the first grid groups are arranged along a first direction and disposed at intervals, and at least one of the second grid groups is disposed between two adjacent first grid groups; each of the first grid groups includes a plurality of the touch control line grids arranged along a second direction and connected to each other in sequence, each of the second grid groups includes another plurality of the touch control line grids arranged along the second direction, and the first direction intersects the second direction; and
a number of the touch control line grids in each of the first grid groups is greater than a number of the touch control line grids in each of the second grid groups, and the two adjacent first grid groups are electrically connected to each other by the touch control line grids in the at least one of the second grid groups.

In a second aspect, the present disclosure provides a display panel, which includes:
a display substrate including a display area and a bezel area positioned on one side of the display area, wherein, the bezel area includes a bonding area; and
a touch control functional layer including a touch control signal wiring layer and a touch control electrode layer disposed on the display substrate in a stack; wherein, the touch control electrode layer includes a plurality of touch control sensing blocks, and at least a part of the touch control sensing blocks is disposed in the display area; the touch control signal wiring layer includes a plurality of signal wirings, and the signal wirings are correspondingly connected to the touch control sensing blocks by one to one and extend to the bonding area;
wherein, the touch control functional layer includes a fan-out area positioned on one side of the display area adjacent to the bezel area, and at least a part of the fan-out area is positioned in the display area; and the signal wirings extend to the bonding area through the fan-out area and include a converging section positioned in the fan-out area, and an extending direction of the converging section intersects a direction from the fan-out area to the bonding area.

Optionally, the touch control sensing blocks are disposed in the display area.

Optionally, the display substrate includes a substrate and a light-emitting layer disposed in a stack, the light-emitting layer includes a plurality of pixel units disposed at intervals, and the pixel units are positioned in the display area and include sub-pixel units; and the signal wirings in the display area are staggered from the sub-pixel units.

Optionally, the signal wirings intersect to form a plurality of signal wiring grids, and each of the signal wiring grids corresponds to at least one of the sub-pixel units.

Optionally, the signal wiring grids correspond to the sub-pixel units by one to one.

Optionally, the touch control sensing blocks include a plurality of touch control electrode lines, and at least a part of the touch control electrode lines is staggered from the signal wirings.

Optionally, the converging section extends along a length direction of an edge of the display area adjacent to the bezel area.

Optionally, the touch control electrode lines of the touch control sensing blocks intersect to form a plurality of touch control line grids, and each of the touch control line grids corresponds to at least one of the sub-pixel units;

the touch control line grids include a plurality of first grid groups and a plurality of second grid groups, the first grid groups are arranged along a first direction and disposed at intervals, and at least one of the second grid groups is disposed between two adjacent first grid groups; each of the first grid groups includes a plurality of the touch control line grids arranged along a second direction and connected to each other in sequence, each of the second grid groups includes another plurality of the touch control line grids arranged along the second direction, and the first direction intersects the second direction; and a number of the touch control line grids in each of the first grid groups is greater than a number of the touch control line grids in each of the second grid groups, and the two adjacent first grid groups are electrically connected to each other by the touch control line grids in the at least one of the second grid groups.

Optionally, the touch control line grids correspond to the sub-pixel units by one to one.

Optionally, the number of the touch control line grids in each of the second grid groups is two, and the two touch control line grids in each of the second grid groups are arranged on two opposite edges of each of the touch control sensing blocks.

Optionally, the fan-out area is all in the display area.

Optionally, a width of the signal wirings is greater than or equal to a width of the touch control electrode lines.

Optionally, the display panel further includes a drive integrated circuit disposed in the bonding area, and the signal wirings extend to the bonding area and are connected to the drive integrated circuit; and the drive integrated circuit includes a touch control drive circuit and a display drive circuit.

In a third aspect, the present disclosure provides a display device including the display panel provided in the present disclosure.

Beneficial effect: the present disclosure provides the display panel and the display device. The display panel includes the display substrate and the touch control functional layer. The display substrate includes the display area and the bezel area positioned on one side of the display area, and the bezel area includes the bonding area. The touch control functional layer includes the touch control signal wiring layer and the touch control electrode layer disposed on the display substrate in the stack. The touch control electrode layer includes the plurality of touch control sensing blocks, and at least the part of the touch control sensing blocks is disposed in the display area. The touch control signal wiring layer includes the plurality of signal wirings, and the signal wirings are correspondingly connected to the touch control sensing blocks by one to one and extend to the bonding area. The touch control functional layer includes the fan-out area positioned on one side of the display area adjacent to the bezel area, and at least the part of the fan-out area is positioned in the display area. The signal wirings extend to the bonding area through the fan-out area and include the converging section positioned in the fan-out area, and the extending direction of the converging section intersects the direction from the fan-out area to the bonding area. The present disclosure reduces spaces occupied by the fan-out area in the bezel area, reduces a bezel size of the display panel, and also prevents the signal wirings from occupying spaces of the touch control sensing blocks in the display area by disposing the touch control signal wiring layer and the touch control electrode layer in different layers and disposing at least the part of the fan-out area in the display area, thereby ensuring touch control performances.

BRIEF DESCRIPTION OF THE SEVERAL VIEWS OF THE DRAWINGS

The following detailed description of specific embodiments of the present disclosure will make the technical solutions and other beneficial effects of the present disclosure obvious with reference to the accompanying drawings.

Figure 1:
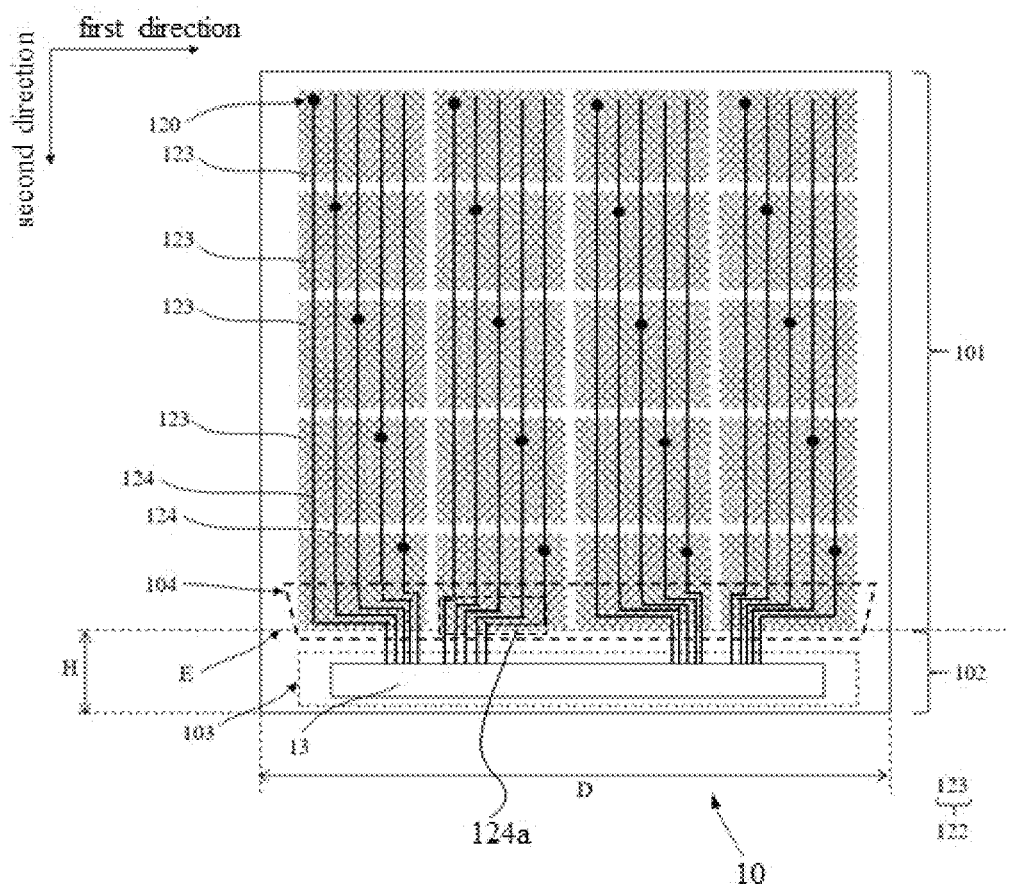
FIG. 1 is a schematic structural diagram of a display panel according to a first embodiment of the present disclosure.

| reference number | component name | reference number | component name |
|---|---|---|---|
| 10 | display panel | 11 | display substrate |
| 101 | display area | 102 | bezel area |
| 103 | bonding area | 104 | fan-out area |

-continued

| reference number | component name | reference number | component name |
|---|---|---|---|
| 12 | touch control functional layer | 121 | touch control signal wiring layer |
| 122 | touch control electrode layer | 123 | touch control sensing block |
| 124 | signal wiring | 124a | converging section |
| 1240 | signal wiring grid | 11221 | sub-pixel unit |
| 111 | substrate | 112 | light-emitting layer |
| 1121 | cathode layer | 1122 | light-emitting material layer |
| 1123 | anode layer | H | height |
| 1122a | pixel unit | 1230 | touch control line grid |
| 1231 | touch control electrode line | 123a | first grid group |
| 123b | second grid group | W1 | first width |
| W2 | second width | E | edge |
| D | length | 113 | thin film transistor layer |
| 120 | through-hole | 13 | drive integrated circuit |
| 110 | encapsulation layer | | |

DESCRIPTION OF SPECIFIC EMBODIMENTS OF THE INVENTION

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure, and are not used to limit the disclosure. In the present disclosure, in the case of no explanation to the contrary, the orientation words used such as "on" and "under" usually refer to upper and lower directions of the device in actual use or working state, specifically the directions in the drawings, and "inside" and "outside" refer to the outline of the device.

An embodiment of the present disclosure provides a display panel and a display device. The following will describe them in detail, respectively. It should be noted that an order of description in the following embodiments is not meant to limit a preferred order of the embodiments.

Figure 2:
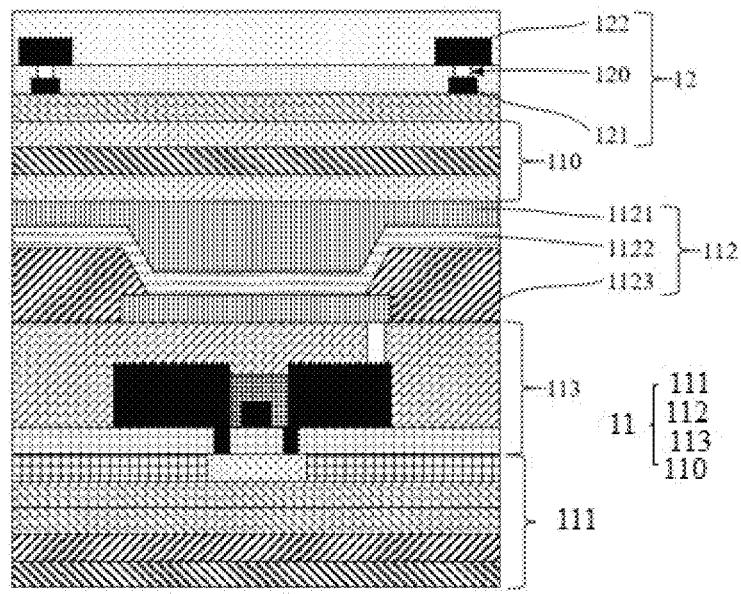
FIG. 2 is a schematic cross-sectional diagram of the display panel according to an embodiment of the present disclosure.

At first, the present disclosure provides the display panel. With reference to FIGS. 1 and 2, the display panel 10 includes a display substrate 11 and a touch control functional layer 12. The display substrate 11 includes a display area 101 and a bezel area 102 positioned on one side of the display area 101. The touch control functional layer 12 includes a touch control signal wiring layer 121 and a touch control electrode layer 122 disposed on the display substrate 11 in a stack.

The touch control electrode layer 122 includes a plurality of touch control sensing blocks 123, and at least a part of the touch control sensing blocks 123 is disposed in the display area 101. The touch control signal wiring layer 121 includes a plurality of signal wirings 124, and the signal wirings 124 correspond to and are electrically connected to the touch control sensing blocks 123 by one to one. The signal wirings 124 extend to a bonding area 103.

In the embodiment of the present disclosure, with reference to FIGS. 1 and 2, the touch control signal wiring layer 121 and the touch control electrode layer 122 are connected to each other by through-holes 120, thereby realizing connections between the signal wirings 124 and the touch control sensing blocks 123. It can be understood that the touch control signal wiring layer 121 and the touch control electrode layer 122 may also adopt other connecting methods, and is not limited here.

It should be noted that the touch control sensing blocks 123 may be positioned in the display area 101 in parts, or all of the touch control sensing blocks 123 are positioned in the display area 101. Preferably, all of the touch control sensing blocks 123 are positioned in the display area 101, that is, an area where the touch control electrode layer 122 is located overlaps the display area 101. Therefore, touch control operations can be performed in all the display area 101 of the display panel 10, thereby increasing a touch control sensing range.

The touch control sensing blocks 123 are correspondingly connected to the signal wirings 124 in the touch control signal wiring layer 121 by one to one, and the signal wirings 124 extend to the bonding area 103 and are connected to a drive integrated circuit 13 in the bonding area 103. Touch control signal transmissions can be realized by the signal wirings 124 connecting the touch control sensing blocks 123 to the drive integrated circuit 13. It should be noted that the drive integrated circuit 13 may be a touch control drive circuit, or a combination of the touch control drive circuit and a display drive circuit.

As shown in FIG. 1, the touch control functional layer 12 includes a fan-out area 104, and the signal wirings 124 extend to the bonding area 103 through the fan-out area 104. The signal wirings 124 in the fan-out area 104 include a converging section 124a extending along a length direction of an edge E of the display area 101 adjacent to the fan-out area 104.

The display area 101 has the edge E adjacent to the bonding area 103, and the length direction of the edge E is a first direction shown in FIG. 1. The signal wirings 124 in the fan-out area 104 include the converging section 124a extending along the first direction, that is, a part of the signal wirings 124 in the fan-out area 104 extends from the display area 101 to the bonding area 103, and another part thereof extends along the first direction. Therefore, a length D of the signal wirings 124 adjacent to the bezel area 102 in the first direction can be reduced, thereby allowing a wiring structure to be more compact. At least a part of the fan-out area 104 is positioned in the display area 101, that is, at least the part of the fan-out area 104 overlaps the display area 101.

Referring to FIG. 1, it should be noted that in the fan-out area 104, the converging section 124a of the signal wirings 124 may extend in the first direction or other directions intersecting the first direction. That is, the signal wirings 124 in the fan-out area 104 may extend in a horizontal direction or an oblique direction, and is not specifically limited herein.

The signal wirings 124 in the fan-out area 104 can be converged in the display area 101 by disposing at least the part of the fan-out area 104 in the display area 101, so a space required for the signal wirings 124 in the bezel area 102 is reduced. Therefore, a height H of a bezel of the display panel 10 in a second direction can be reduced, thereby realizing a narrow bezel design. Meanwhile, since the touch control signal wiring layer 121 and the touch control electrode layer 122 are disposed in different layers, the present disclosure can prevent the signal wirings 124 from occupying spaces of the touch control sensing blocks 123 in the display area 101, thereby ensuring touch control performances.

Figure 3:
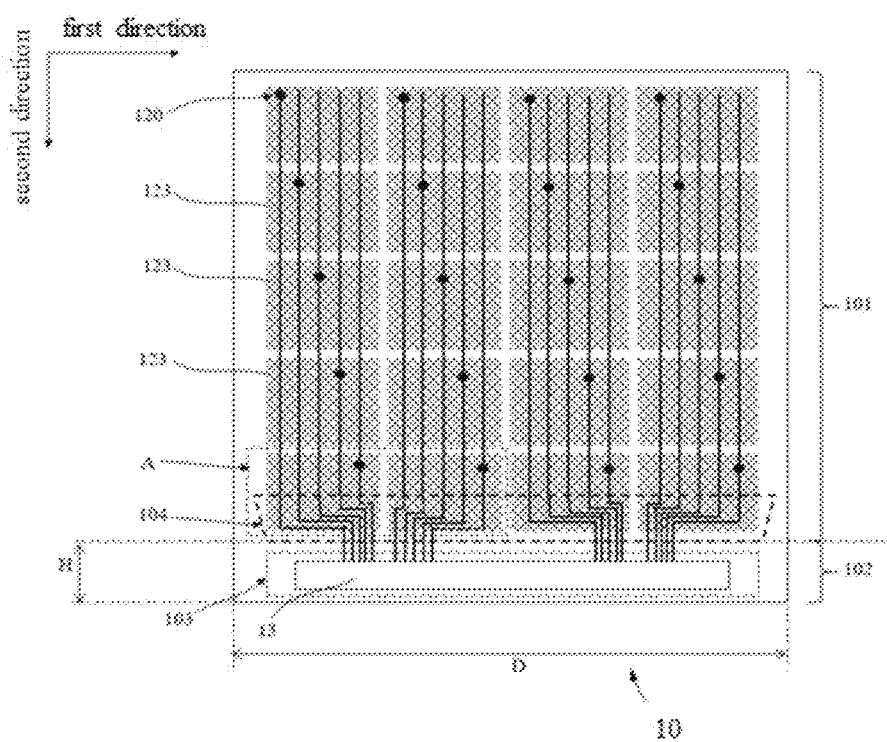
FIG. 3 is a schematic structural diagram of the display panel according to a second embodiment of the present disclosure.

It should be noted that the fan-out area 104 may be positioned in the display area 101 in parts, or the fan-out area 104 is all positioned in the display area 101. Preferably, as shown in FIG. 3, the fan-out area 104 is all positioned in the display area 101, that is, the display area 101 covers the fan-out area 104. With reference to FIGS. 2 and 3, the touch control electrode layer 122 overlaps the display area 101, and the touch control electrode layer 122 covers the signal wirings 124 in the fan-out area 104.

The space occupied by the signal wirings 124 in the bezel area 102 can be reduced to a greatest extent by disposing the fan-out area 104 all in the display area 101, thereby being beneficial to further reduce the height H of the bezel area 102 of the display panel 10 in the second direction. That is, it can reduce a bezel size of the display panel 10, thereby realizing the narrow bezel design.

With reference to FIGS. 2 to 5, in the embodiment of the present disclosure, a thin film transistor layer 113, a light-emitting layer 112, an encapsulation layer 110, and the touch control functional layer 12 are stacked on a substrate 111 in sequence. The light-emitting layer 112 includes an anode layer 1123, a light-emitting material layer 1122, and a cathode layer 1121 disposed in a stack. Wherein, the light-emitting material layer 1122 includes a plurality of pixel units 1122a, and each of the pixel units 1122a includes a plurality of sub-pixel units 11221.

Figure 6:
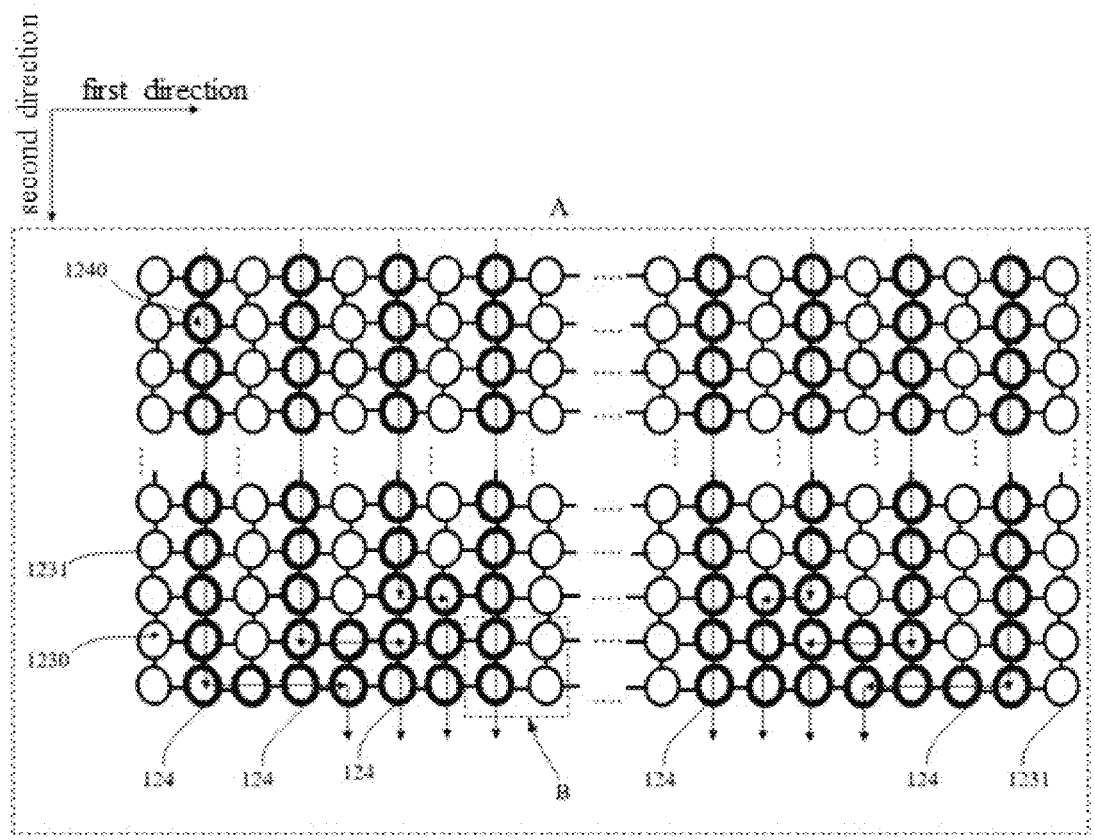
FIG. 6 is a schematic partial enlarged diagram of an area A in FIG. 3.

As shown in FIG. 6, the signal wirings 124 intersect to form a plurality of signal wiring grids 1240, that is, the signal wirings 124 have a grid-shaped structure. By setting the signal wirings 124 as the grid-shaped structure, at least a part of the signal wiring grids 1240 is allowed to correspond to the sub-pixel units 11221, that is, the signal wirings 124 surround the sub-pixel units 11221, thereby realizing the signal wirings 124 in the display area 101 to be staggered from the sub-pixel units 11221. Therefore, it can prevent the signal wirings 124 from shielding the sub-pixel units 11221 and affecting display effect. It should be noted that straight lines with arrows in FIG. 6 indicate extending directions of the signal wirings 124.

Figure 7:
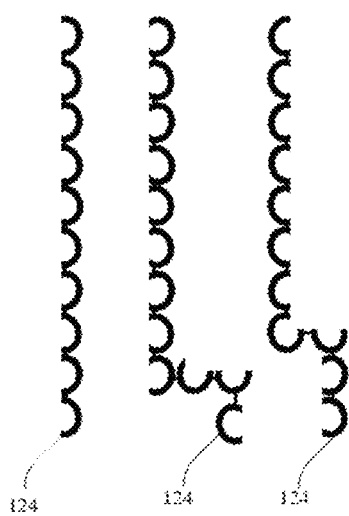
FIG. 7 is a schematic structural diagram of signal wirings according to an embodiment of the present disclosure.

It can be understood that the signal wirings 124 may also adopt a non-grid structure. As shown in FIG. 7, the signal wirings 124 extend in a curving configuration to avoid the sub-pixel units 11221. The signal wirings 124 adopting the grid-shaped structure, that is, the signal wirings 124 are connected by the signal wiring grids 1240 that are closed, is beneficial to reduce resistances of the signal wirings 124.

It should be noted that a shape of the signal wiring grids 1240 may be determined according to a shape of the sub-pixel units 11221. As shown in FIG. 6, the shape of the signal wiring grids 1240 is oval, that is, a part of the signal wirings 124 is arc-shaped. It can be understood that when the shape of the sub-pixel units 11221 is rectangular, the shape of the signal wiring grids 1240 is rectangular, that is, the signal wirings 124 are all straight lines. Each of the signal wiring grids 1240 may correspond to one of the sub-pixel units 11221 or a plurality of the sub-pixel units 11221, that is, one of the signal wiring grids 1240 may surround the plurality of the sub-pixel units 11221. The details can be determined according to actual situations, and are not limited here.

With reference to FIGS. 2 to 5, in the embodiment of the present disclosure, the touch control sensing blocks 123 include a plurality of touch control electrode lines 1231, and the touch control electrode lines 1231 intersect to form a plurality of touch control line grids 1230. That is, the touch control sensing blocks 123 have the grid-shaped structure, and the touch control line grids 1230 are surrounded by the touch control electrode lines 1231. A plurality of the touch control line grids 1230 correspond to at least one of the sub-pixel units 11221.

Figure 4:
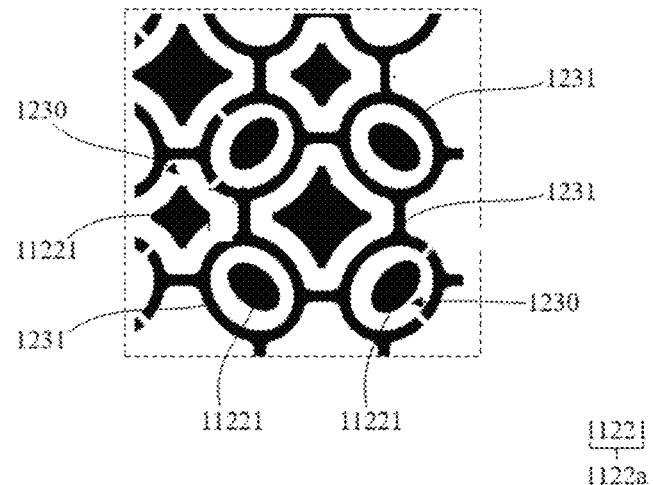
FIG. 4 is a schematic partial enlarged diagram of touch control electrode lines and pixel units according to an embodiment of the present disclosure.
Figure 5:
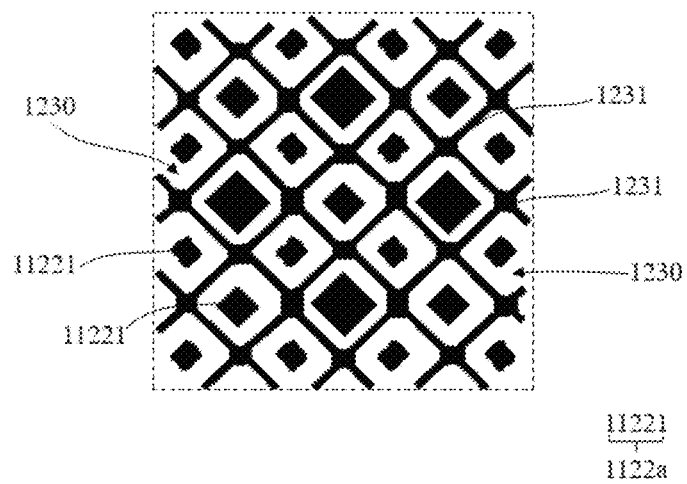
FIG. 5 is a schematic partial enlarged diagram of the touch control electrode lines and the pixel units according to another embodiment of the present disclosure.

It should be noted that a shape of the touch control line grids 1230 may be determined according to actual situations. As shown in FIG. 4, the shape of a part of the sub-pixel units 11221 is oval, the touch control line grids 1230 corresponding to oval sub-pixel units 11221 are also set to be oval, and the touch control electrode lines 1231 surround the pixel units 1122a. As shown in FIG. 5, the shape of a part of the sub-pixel units 11221 is rectangular, correspondingly, the touch control line grids 1230 corresponding to rectangular sub-pixel units 11221 are also set to be rectangular, and the touch control electrode lines 1231 surrounding the sub-pixel units 11221 are straight lines. The shape of the touch control line grids 1230 is not limited herein.

Setting the touch control sensing blocks 123 as the grid-shaped structure can allow the touch control electrode lines 1231 to avoid the sub-pixel units 11221. Therefore, it can prevent the touch control electrode lines 1231 from shielding the sub-pixel units 11221 and affecting the display effect. It should be noted that each of the touch control line grids 1230 may correspond to one of the sub-pixel units 11221 or a plurality of the sub-pixel units 11221, that is, one of the touch control line grids 1230 may surround the plurality of the sub-pixel units 11221. The details can be determined according to actual situations, and are not limited here.

Figure 8:
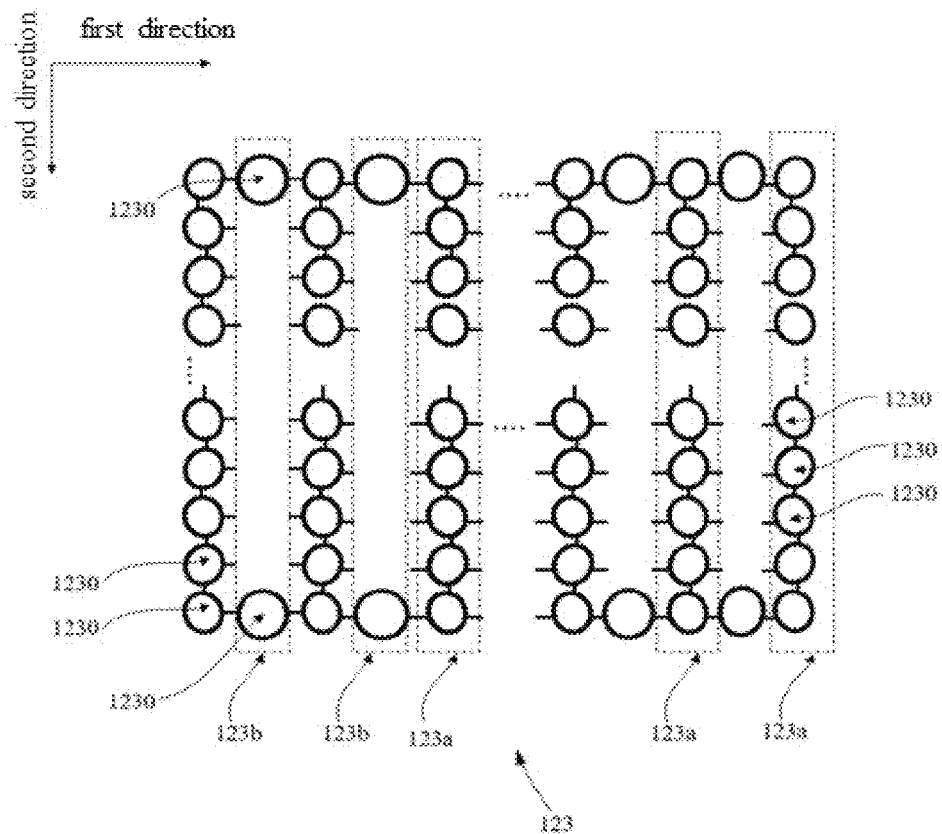
FIG. 8 is a schematic diagram of a touch control sensing block after hollowing out according to an embodiment of the present disclosure.

As shown in FIG. 8, each of the touch control sensing blocks 123 includes a plurality of first grid groups 123a and a plurality of second grid groups 123b, the first grid groups 123a are arranged along the first direction and are disposed at intervals, and at least one of the second grid groups 123b is disposed between two adjacent first grid groups 123a. Wherein, each of the first grid groups 123a includes a plurality of the touch control line grids 1230 arranged along the second direction and connected to each other in sequence, and each of the second grid groups 123b includes another plurality of the touch control line grids 1230 arranged along the second direction.

As shown in FIG. 8, the first grid groups 123a are arranged to form a plurality of columns in the first direction, and each column of the first grid groups 123a is spaced apart from each other. The touch control line grids 1230 in each of the first grid groups 123a are connected to each other and are arranged in the second direction. The second grid groups 123b are arranged to form a plurality of columns in the first direction, and the touch control line grids 1230 in each of the second grid groups 123b are arranged in the second direction. The two adjacent first grid groups 123a are electrically connected to each other by the at least one of the second grid groups 123b disposed between the two adjacent first grid groups 123a. That is, the touch control line grids 1230 in the second grid groups 123b serve as horizontal connecting parts to connect two adjacent columns of the first grid groups 123a.

With reference to FIGS. 6 to 8, a number of the touch control line grids 1230 in each of the first grid groups 123a is greater than a number of the touch control line grids 1230 in each of the second grid groups 123b. That is, partial areas in the touch control sensing blocks 123 are hollowed out to remove a part of the touch control electrode lines 1231. Therefore, it can realize that at least a part of the touch control electrode lines 1231 is staggered from the signal wirings 124, thereby reducing an overlapping area of the touch control electrode lines 1231 and the signal wirings 124. Therefore, parasitic capacitances affecting touch control functions, which are generated by overlapping the touch control electrode layer 122 and the touch control signal wiring layer 121, can be reduced.

It should be noted that hollowed-out areas in the touch control sensing blocks 123 may be determined according to actual situations. Preferably, as shown in FIG. 8, the second grid groups 123*b* are only disposed on edges of the touch control sensing blocks 123. That is, the first grid groups 123*a* only have the horizontal connecting parts on the edges of the touch control sensing blocks 123, and the two adjacent first grid groups 123*a* are electrically connected to each other in the first direction by two touch control line grids 1230. Therefore, a smallest overlapping area of the touch control electrode lines 1231 and the signal wirings 124 can be realized, thereby preventing the parasitic capacitances generated between the touch control electrode layer 122 and the touch control signal wiring layer 121 from affecting the touch control functions.

It can be understood that the first direction and the second direction may intersect or be perpendicular to each other. In the embodiments of the present disclosure, the first direction is perpendicular to the second direction.

In some embodiments of the present disclosure, a width of the signal wirings 124 is greater than or equal to a width of the touch control electrode lines 1231.

Figure 9:
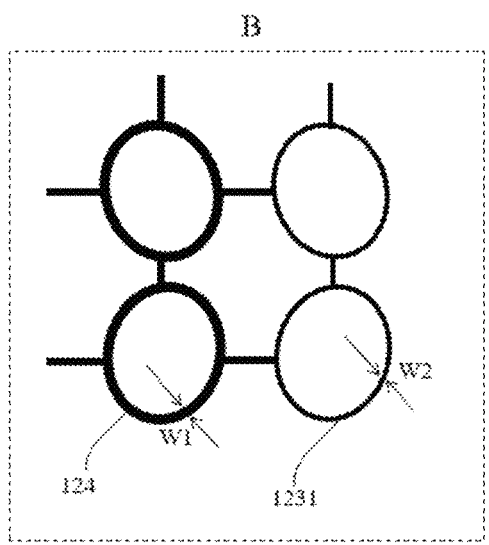
FIG. 9 is a schematic partial enlarged diagram of an area B in FIG. 6.

As shown in FIG. 9, the signal wirings 124 have a first width W1, the touch control electrode lines 1231 have a second width W2, and the first width W1 is greater than the second width W2. Resistances of the signal wirings 124 can be reduced by disposing wider signal wirings 124, thereby being beneficial to improve the touch control performances of the display panel 10.

An embodiment of the present disclosure further provides the display device. The display device includes the display panel. A specific structure of the display panel can refer to the above embodiments. Since the display device adopts all technical solutions of all the foregoing embodiments, it has at least all the beneficial effects brought about by the technical solutions of the foregoing embodiments. Therefore, it will not be repeated here.

The display device includes the display panel 10, a control circuit, and a housing. Wherein, the housing is connected to the display panel 10 to support and fix the display panel 10, the control circuit is disposed in the housing, and the control circuit is electrically connected to the display panel 10 to control the display panel 10 to display images.

Wherein, the display panel 10 may be fixed to the housing to form an integrated body with the housing, and the display panel 10 and the housing form a closed space for accommodating the control circuit. The control circuit may be a motherboard of the display device. At a same time, the control circuit may also be integrated with one or more of functional components such as a battery, an antenna structure, a microphone, a speaker, a headphone interface, a universal serial bus interface, a camera, a distance sensor, an ambient light sensor, a receiver, and a processor to allow the display device to adapt to various application fields.

It should be noted that the display device is not limited to the above content and can further include other devices, such as the camera, the antenna structure, and a fingerprint unlocking module, to expand its scope of use, so it is not limited here.

It should be noted that the display device in the embodiments of the present disclosure has a wide range of applications, including televisions, computers, mobile phones, flexible organic light-emitting diode (OLED) displays and illuminators such as foldable and rollable OLEDs, as well as wearable devices such as smart bracelets, smart watches, and virtual reality (VR), etc., which are all within the scope of the application fields of the display device in the embodiment of the present disclosure.

The display panel and the display device provided by the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A display panel, comprising:
a display substrate comprising a display area and a bezel area positioned on one side of the display area, wherein the bezel area comprises a bonding area; and
a touch control functional layer comprising a touch control signal wiring layer and a touch control electrode layer disposed on the display substrate in a stack, wherein the touch control signal wiring layer and the touch control electrode layer are connected to each other by through-holes; wherein the touch control electrode layer comprises a plurality of touch control sensing blocks, and at least a part of the plurality of touch control sensing blocks is disposed in the display area; the touch control signal wiring layer comprises a plurality of signal wirings, and the plurality of signal wirings are correspondingly connected to the plurality of touch control sensing blocks by one to one and extend to the bonding area;
wherein the touch control functional layer comprises a fan-out area positioned on one side of the display area adjacent to the bezel area, and at least a part of the fan-out area is positioned in the display area; and the plurality of signal wirings extend to the bonding area through the fan-out area and comprise a converging section positioned in the fan-out area, and an extending direction of the converging section intersects a direction from the fan-out area to the bonding area;
wherein the display substrate comprises a substrate and a light-emitting layer disposed in a stack, the light-emitting layer comprises a plurality of pixel units disposed at intervals, and the plurality of pixel units are positioned in the display area and comprise sub-pixel units;
wherein the plurality of touch control sensing blocks comprise a plurality of touch control electrode lines;
wherein the plurality of touch control electrode lines of the plurality of touch control sensing blocks intersect to form a plurality of touch control line grids, and each of the plurality of touch control line grids corresponds to at least one of the sub-pixel units;
the plurality of touch control line grids comprise a plurality of first grid groups and a plurality of second grid groups, the plurality of first grid groups are arranged along a first direction and disposed at intervals, and at least one of the plurality of second grid groups is disposed between two adjacent first grid groups of the plurality of first grid groups; each of the plurality of first grid groups comprises a group of the plurality of touch control line grids arranged along a second direction and connected to each other in sequence, each of the plurality of second grid groups comprises another group of the plurality of touch control line grids arranged along the second direction, and the first direction intersects the second direction; and a number of touch control line grids in each of the plurality of first grid groups is greater than a number of touch control line grids in each of the plurality of second grid groups, and the two adjacent first grid groups are electrically connected to each other by touch control line grids in the at least one of the plurality of second grid groups.

2. The display panel according to claim 1, wherein the plurality of signal wirings in the display area are staggered from the sub-pixel units.

3. The display panel according to claim 2, wherein the plurality of signal wirings intersect to form a plurality of signal wiring grids, and each of the plurality of signal wiring grids corresponds to at least one of the sub-pixel units.

4. The display panel according to claim 2, wherein at least a part of the touch control electrode lines is staggered from the plurality of signal wirings.

5. The display panel according to claim 4, wherein the converging section extends along a length direction of an edge of the display area adjacent to the bezel area.

6. A display device, comprising the display panel according to claim 1.

7. A display panel, comprising:
a display substrate comprising a display area and a bezel area positioned on one side of the display area, wherein the bezel area comprises a bonding area; and
a touch control functional layer comprising a touch control signal wiring layer and a touch control electrode layer disposed on the display substrate in a stack; wherein the touch control electrode layer comprises a plurality of touch control sensing blocks, and at least a part of the plurality of touch control sensing blocks is disposed in the display area; the touch control signal wiring layer comprises a plurality of signal wirings, and the plurality of signal wirings are correspondingly connected to the plurality of touch control sensing blocks by one to one and extend to the bonding area;
wherein the touch control functional layer comprises a fan-out area positioned on one side of the display area adjacent to the bezel area, and at least a part of the fan-out area is positioned in the display area; and the plurality of signal wirings extend to the bonding area through the fan-out area and comprise a converging section positioned in the fan-out area, and an extending direction of the converging section intersects a direction from the fan-out area to the bonding area;
wherein the display substrate comprises a substrate and a light-emitting layer disposed in a stack, the light-emitting layer comprises a plurality of pixel units disposed at intervals, and the plurality of pixel units are positioned in the display area and comprise sub-pixel units;
wherein the plurality of touch control sensing blocks comprise a plurality of touch control electrode lines,
wherein the plurality of touch control electrode lines of the plurality of touch control sensing blocks intersect to form a plurality of touch control line grids, and each of the plurality of touch control line grids corresponds to at least one of the sub-pixel units;

the plurality of touch control line grids comprise a plurality of first grid groups and a plurality of second grid groups, the plurality of first grid groups are arranged along a first direction and disposed at intervals, and at least one of the plurality of second grid groups is disposed between two adjacent first grid groups of the plurality of first grid groups; each of the plurality of first grid groups comprises a group of the plurality of touch control line grids arranged along a second direction and connected to each other in sequence, each of the plurality of second grid groups comprises another group of the plurality of touch control line grids arranged along the second direction, and the first direction intersects the second direction; and a number of touch control line grids in each of the plurality of first grid groups is greater than a number of touch control line grids in each of the plurality of second grid groups, and the two adjacent first grid groups are electrically connected to each other by touch control line grids in the at least one of the plurality of second grid groups.

8. The display panel according to claim 7, wherein the plurality of touch control sensing blocks are disposed in the display area.

9. The display panel according to claim 7, wherein the plurality of signal wirings in the display area are staggered from the sub-pixel units.

10. The display panel according to claim 9, wherein the plurality of signal wirings intersect to form a plurality of signal wiring grids, and each of the plurality of signal wiring grids corresponds to at least one of the sub-pixel units.

11. The display panel according to claim 10, wherein the plurality of signal wiring grids correspond to the sub-pixel units by one to one.

12. The display panel according to claim 9, wherein at least a part of the plurality of touch control electrode lines is staggered from the plurality of signal wirings.

13. The display panel according to claim 12, wherein the converging section extends along a length direction of an edge of the display area adjacent to the bezel area.

14. The display panel according to claim 12, wherein a width of each of the plurality of signal wirings is greater than or equal to a width of each of the plurality of touch control electrode lines.

15. The display panel according to claim 7, wherein the plurality of touch control line grids correspond to the sub-pixel units by one to one.

16. The display panel according to claim 7, wherein the number of touch control line grids in each of the plurality of second grid groups is two, and two touch control line grids in each of the plurality of second grid groups are arranged on two opposite edges of each of the plurality of touch control sensing blocks.

17. The display panel according to claim 7, wherein the fan-out area is all in the display area.

18. The display panel according to claim 7, further comprising a drive integrated circuit disposed in the bonding area, wherein the plurality of signal wirings extend to the bonding area and are connected to the drive integrated circuit; and the drive integrated circuit comprises a touch control drive circuit and a display drive circuit.

* * * * *